(12) United States Patent
Choi et al.

(10) Patent No.: US 7,314,825 B2
(45) Date of Patent: Jan. 1, 2008

(54) METHOD FOR FORMING CONTACT PLUG OF SEMICONDUCTOR DEVICE

(75) Inventors: Bong-Ho Choi, Ichon-shi (KR); Ik-Soo Choi, Ichon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 281 days.

(21) Appl. No.: 11/026,226

(22) Filed: Dec. 28, 2004

(65) Prior Publication Data

US 2005/0272245 A1 Dec. 8, 2005

(30) Foreign Application Priority Data

Jun. 8, 2004 (KR) ................. 10-2004-0041725

(51) Int. Cl.
*H01L 21/4763* (2006.01)
(52) U.S. Cl. ..................... 438/637; 438/629
(58) Field of Classification Search ............. 438/637, 438/629, 672, 597
See application file for complete search history.

(56) References Cited

U.S. PATENT DOCUMENTS 6,337,275 B1 * 1/2002 Cho et al. ................ 438/675
6,403,459 B1 * 6/2002 Ohashi et al. ............. 438/618
6,458,680 B2 * 10/2002 Chung et al. .............. 438/597
6,518,157 B2 2/2003 Nam et al.
6,689,697 B1 2/2004 Jiang et al.

* cited by examiner

*Primary Examiner*—Thao P. Le
(74) *Attorney, Agent, or Firm*—Townsend & Townsend & Crew, LLP

(57) ABSTRACT

Disclosed is a method for fabricating a semiconductor device; and more particularly, to a method for fabricating a plurality of contact plugs capable of preventing a self-aligned contact (SAC) fail during forming a plurality of contact holes formed by using a SAC etching process and a defect generation during performing a plug isolation process. The present invention prevents a Pinocchio defect that is a fundamental problem caused by the chemical mechanical polishing (CMP) process and simplifies a subsequent cleaning process performed according to the particles. Accordingly, it is possible to develop products with a high quality and a high speed and to replace the CMP process having a high unit process cost with an etch back process, thereby providing an effect of increasing a price competitiveness.

20 Claims, 5 Drawing Sheets

METHOD FOR FORMING CONTACT PLUG OF SEMICONDUCTOR DEVICE

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

1. Field of the Invention

The present invention relates to a method for fabricating a semiconductor device; and more particularly, to a method for fabricating a plurality of contact plugs capable of preventing a self-aligned contact (SAC) fail during forming a plurality of contact holes formed by using a SAC etching process and a defect generation during performing a plug isolation process.

2. Description of Related Arts

In general, a semiconductor device is comprised of a plurality of unit pixels inside of the semiconductor device. A trend in a large-scale of integration has brought a need to form semiconductor devices densely within a confined cell region. Thus, the size of unit devices of a semiconductor device, for instance, transistors and capacitors, has been gradually decreased. Particularly, in a dynamic random access memory (DRAM) device, the size of the unit devices formed within a cell region has been decreased as the design rule has been shifted towards minimization. For instance, DRAM devices are currently formed to have a minimum linewidth less than 0.1 μm and are often required to have a linewidth less than 80 nm. Hence, there exist many difficulties in applying conventional fabrication methods.

In case of applying a photolithography using ArF having a wavelength of 193 nm to a semiconductor device having a linewidth less than 80 nm, it is necessary to develop an additional recipe for preventing a photoresist deformation created during an etching process employed for the purposes of forming a fine pattern and a vertical etch profile. Accordingly, when fabricating the semiconductor device having a linewidth less than 80 nm, a conventional requirement for etching and a new requirement for preventing a pattern deformation should be simultaneously satisfied.

Meanwhile, advancement in an integration level of a semiconductor device has led device elements to be formed in stacks. A contact plug or a contact pad is one example of such stack structure.

For the contact plug, a landing plug contact (LPC) is commonly used since the LPC has a bottom portion which makes a wide contact within a minimum area and a top portion which is wider than the bottom portion for increasing a contact margin.

Furthermore, for forming such a LPC, there is a difficulty of etching between structures having a high aspect ratio. At this time, a self-aligned contact (SAC) etching process obtaining an etch profile by using an etch selectivity ratio of two materials, e.g., an oxide layer and a nitride layer is introduced.

For the SAC etching process, CF and CHF based gases are used, and it is also necessary to have an etch stop layer using a nitride layer for the purpose of preventing an attack to a conductive pattern of a lower portion or a spacer.

Hereinafter, a process forming a plurality of cell contacts by using the SAC etching process will be explained. FIGS. 1A to 1D are cross sectional views illustrating a conventional process forming a plurality of cell contacts.

First, referring to FIG. 1A, a plurality of gate electrode patterns G1 and G2 is formed on a substrate 100 provided with various device elements, i.e., a field insulation layer and a well (not shown) for forming a semiconductor device. Herein, each of the plurality of gate electrode patterns G1 and G2 is formed by stacking a gate conductive layer 101 and a hard mask on the substrate 100.

A gate insulation layer exists between the gate conductive layer 101 and the substrate 100 and uses a typical oxide-based layer such as a silicon oxide layer; however, herein, the gate insulation is omitted.

The gate conductive layer 101 is made of a material selected from a group consisting of polysilicon, tungsten (W), tungsten nitride ($WN_x$), tungsten silicide ($WSi_x$). Also, it is possible to form the gate conductive layer 101 by using a material combining all of the above listed materials.

The gate hard mask 102 serves a role in protecting the gate conductive layer 101 in the course of an etching process for forming a plurality of contact holes by etching an inter-layer insulation layer. The gate hard mask 102 is made of a material having a different etching speed from the inter-layer insulation layer. For instance, in case of using an oxide-based layer for forming the inter-layer insulation layer, a nitride-based layer such as a silicon nitride (SiN) layer or a silicon oxynitirde (SiON) layer is used and in case of using a polymer based low k-dielectric layer for forming the inter-layer insulation layer, an oxide-based layer is used.

An impurity diffusion region (not shown) such as a source/drain junction is formed on the substrate 100 between the plurality of gate electrode patterns G1 and G2.

A spacer (not shown) is formed along a profile formed with the plurality of gate electrode patterns G1 and G2 and then, an etch stop layer 103 is formed to prevent an attack on lower structures such as the spacer and the plurality of gate electrode patterns G1 and G2 from the etching process by employing a subsequent SAC etching method on the above resulting substrate. At this time, it is preferable to form the etch stop layer 103 along the profile of the lower structures. The etch stop layer 103 uses a nitride-based layer.

Subsequently, an oxide-based inter-layer insulation layer 104 is formed on the above resulting substrate provided with the etch stop layer 103.

In case of using an oxide-based layer for forming the inter-layer insulation layer 104, a material selected from a group consisting of a boro-silicate-glass (BSG) layer, a boro-phospho-silicate-glass (BPSG) layer, a phospho-silicate-glass (PSG) layer, a tetra-ethyl-ortho-silicate (TEOS) layer, a high density plasma (HDP) oxide layer, a spin-on-glass (SOG) layer and an advanced planarization layer (APL) is used. Also, it is possible to use an inorganic or organic based low k-dielectric layer to form the inter-layer insulation layer.

Subsequently, the inter-layer insulation layer 104 is planarized by employing a chemical mechanical polishing (CMP) process and then, a nitride layer 105A for forming a sacrificial hard mask is formed on the inter-layer insulation layer 104.

The nitride layer 105A for forming the sacrificial hard mask is patterned by a subsequent process for securing an etching tolerance of a photoresist due to a limitation of a resolution in the course of performing a photolithography process and preventing a pattern deformation.

Subsequently, a photoresist pattern for forming a plurality of cell contact plugs is formed on the nitride layer 105A for forming the sacrificial hard mask.

Meanwhile, during forming the photoresist pattern 106, an anti-reflective coating layer can be used between the photoresist pattern and a lower structure of the photoresist pattern for the purpose of preventing an undesirable pattern formation from a scattered reflection due to a high degree of light reflection during a photo-exposure for a pattern formation and improving an adhesiveness between the photoresist pattern and the lower structure of the photoresist pattern. At this time, the anti-reflective coating layer mainly uses an organic based material having a similar etching property with the photoresist pattern. However, according to a process, the anti-reflective coating layer can be omitted.

More specific to the process for forming the photoresist pattern, a photoresist for ArF or $F_2$ light source, e.g., COMA or acrylaid which is the photoresist for ArF light source, is coated on the lower structure of the anti-reflective coating layer or the nitride layer 105A for forming the sacrificial hard mask in a predetermined thickness by performing a spin coating method. Afterwards, predetermined portions of the photoresist are selectively photo-exposed by using ArF or $F_2$ light source and a predecided reticle (not shown) for defining a width of a contact hole. Thereafter, a developing process proceeds by making a photo-exposed portion or a non-photo-exposed portion remain, and a cleaning process is then performed to remove etch remnants, thereby forming the photoresist pattern 106 which is a cell contact open mask. Herein, the photoresist pattern 106 is an I-type.

Next, referring to FIG. 1B, a sacrificial hard mask 105B defining a region where the cell contact plug is formed by etching the nitride layer 105A for forming the sacrificial hard mask with use of the photoresist pattern 106 as an etch mask.

Subsequently, the photoresist pattern 106 is removed by performing a photoresist stripping process. In case of using an organic based anti-reflective coating layer, the photoresist pattern is removed in the course of the photoresist stripping process.

Next, the inter-layer insulation layer 104 is subject to the SAC etching process by using the sacrificial hard mask 105B as an etch mask, thereby forming a plurality of contact holes exposing the etch stop layer 103 between the gate electrode patterns G1 and G2.

At this time, a typical recipe for the SAC etching process is employed. That is, a fluoride based plasma, e.g., $C_xF_y$, (x and y range from approximately 1 to approximately 10) gas such as $C_2F_4$, $C_2F_6$, $C_3F_8$, $C_4F_6$, $C_5F_8$ or $C_5F_{10}$, is used as a main etch gas along with an additional $C_aH_bF_c$ (a,b and c range from approximately 1 to approximately 10) gas such as $CH_2F_2$, $C_3HF_5$ or $CHF_3$. At this time, an inert gas such as He, Ne, Ar or Xe is used as a carrier gas.

Subsequently, an oxide-based capping layer having a poor step coverage such as an undoped-silicate-glass (USG) layer is deposited. Afterwards, the etch stop layer 103 is removed on lower portions of the plurality of contact holes by using a blanket-etch process, thereby opening the substrate 100 placed in the lower portions of the plurality of contact holes 107, i.e., the impurity diffusion region of the substrate 100.

At this time, the capping layer is formed for the purpose of protecting the hard mask 102 existing upper portion of the plurality of gate electrode patterns G1 and G2 during an opening process performed in the lower portions of the plurality of contact holes 107.

Next, etch remnants and by-products are removed by employing the cleaning process.

Referring to FIG. 1C, a conductive layer 108A for forming a plurality of plugs is deposited in a structure where the lower portions of the plurality of contact holes 107 are opened, thereby filling the plurality of contact holes 107 sufficiently.

The conductive layer 108A for forming the plurality of plugs is mainly made of a polysilicon layer.

Subsequently, a planarization process is performed to expose the gate hard mask 102, thereby forming a plurality of plugs 108B electrically connected with the impurity diffusion region of the substrate through the plurality of contact holes 107 and planarized with the gate hard mask 102. The CMP process is employed during the planarization process performed for isolating the plurality of plugs 108B.

Referring to FIG. 1D, since the nitride-based gate hard mask 102 and the plurality of plugs 108B made of polysilicon has a different polishing ratio from each other, there generates a height difference denoted with a reference denotation A between the gate hard mask 102 and the plurality of plugs 108B.

Furthermore, there generates another height difference denoted with a reference denotation B due to a different etch selectivity of the gate hard mask 102 and the inter-layer insulation layer 104 during a subsequent cleaning process performed for removing a defect generated during the CMP process.

The semiconductor device with a linewidth equal to or less than approximately 100 nm using the described plug forming technology uses the I-type photoresist pattern during forming the plurality of cell contact plugs and employs the CMP process when isolating the plurality of cell contact plugs into a cell contact plug for forming a bit line contact and a cell contact plug for forming a storage node contact.

The CMP process for isolating the plurality of plugs provides an advantage in effectively isolating a material layer consisting of more than three different layers such as a nitride layer, an oxide layer and polysilicon. However, there are following disadvantages.

First, it is very difficult to remove scratches caused by slurry particles and Pinocchio particles. These particles are decreased through a subsequent cleaning process; however, it is impossible to completely remove the defect, thereby degrading a quality of the semiconductor device and yields of products.

Secondly, as excessively polishing to isolate the plurality of plugs into the plug for forming the bit line contact and the plug for forming the storage node contact, there is a height difference of approximately 350 Å between the gate electrode patterns, i.e., between a word line hard mask and a cell contact plug and thus, an additional CMP process subjected to the oxide-based inter-layer insulation layer is necessary to remove the height difference.

Thirdly, since the polishing ratio of the CMP process is larger in an edge region of a wafer than a central region of the wafer, there is a problem of abruptly decreasing a height of the hard mask in the edge region of the wafer.

Fourthly, since the CMP process has a different polishing ratio depending on a density of a pattern, an excessive CMP process is required to overcome a difficulty in isolating a mat edge region where a cell region and a peripheral region meet each other, thereby causing non-uniformity of the gate hard mask.

Accordingly, it is required to develop a process technology for settle the above problems caused during the plug isolation.

BRIEF SUMMARY OF THE INVENTION

It is, therefore, an object of the present invention to provide a method for forming a plurality of contact plugs of a semiconductor device capable of preventing a defect generation during a plug isolation process, controlling a height difference generated by a different polishing ratio between layers subjected to be polished, and settling a problem of non-uniformity of patterns due to a different density between the patterns and a different polishing ratio between an edge region and a central region of a wafer.

In accordance with one aspect of the present invention, there is provided a method for forming a plurality of contact plugs of a semiconductor device, including the steps of: forming a plurality of conductive patterns having a plurality of hard masks on a substrate provided with a conductive layer; forming an etch stop layer along a profile provided with the plurality of conductive patterns; forming an inter-layer insulation layer on the etch stop layer; planarizing the inter-layer insulation layer until the inter-layer insulation layer remains in a thickness ranging from approximately 0 Å to approximately 500 Å on the etch stop layer of upper portions of the conductive patterns; forming a polysilicon layer on the inter-layer insulation layer; forming a plurality of contact holes exposing the etch stop layer between the plurality of conductive patterns by using the polysilicon layer as an etch mask; removing the polysilicon etch mask and the etch stop layer in lower portions of the plurality of contact holes; forming a conductive layer for forming a plurality of plugs to fill the plurality of contact holes; and forming a plurality of isolated plugs by performing a planarizing process using an etch back process to expose the plurality of hard masks.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on preferred embodiments of the present invention will be provided with reference to the accompanying drawings.

FIGS. 2A to 2F are cross-sectional views illustrating a process for forming a plurality of cell contacts in accordance with the present invention.

Figure 1A:
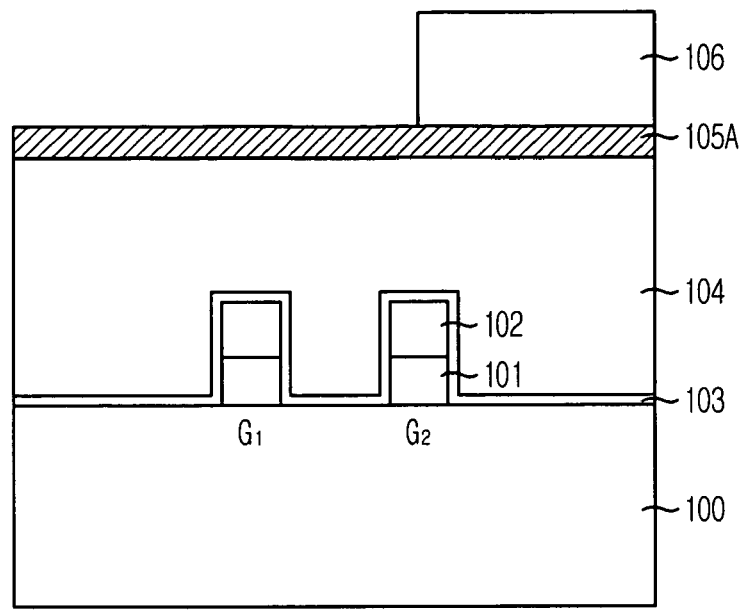
FIGS. 1A to 1D are cross-sectional views illustrating a conventional process for forming a plurality of cell contacts.
Figure 1B:
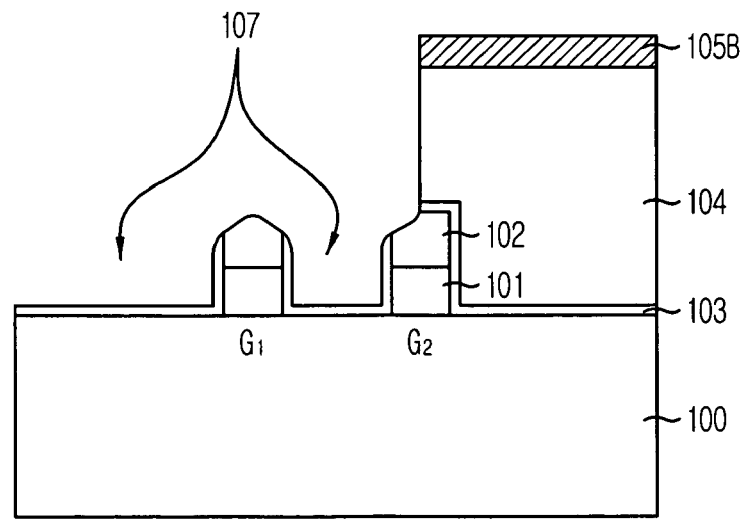
Figure 1C:
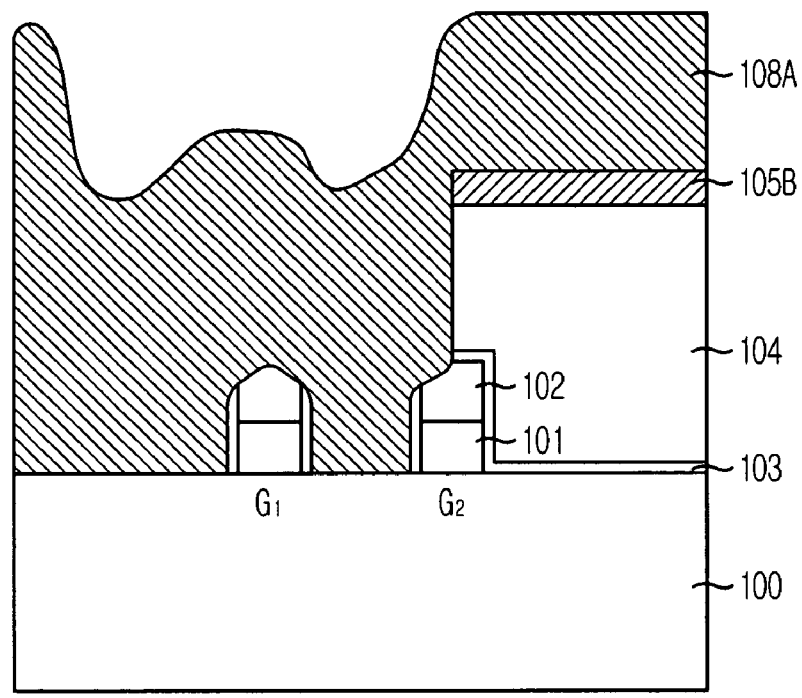
Figure 1D:
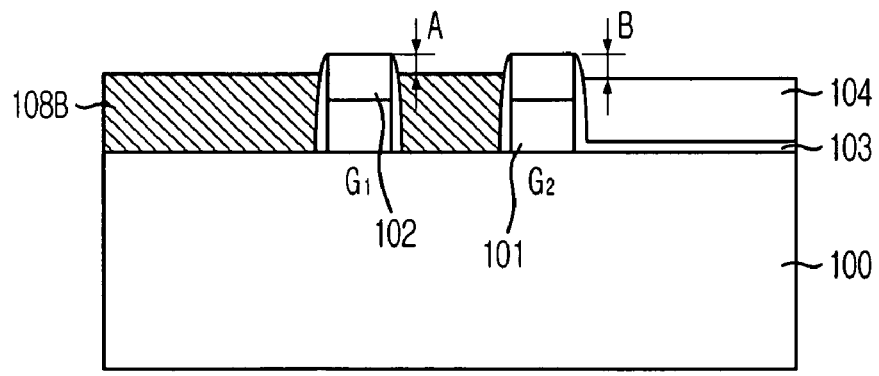
Figure 2A:
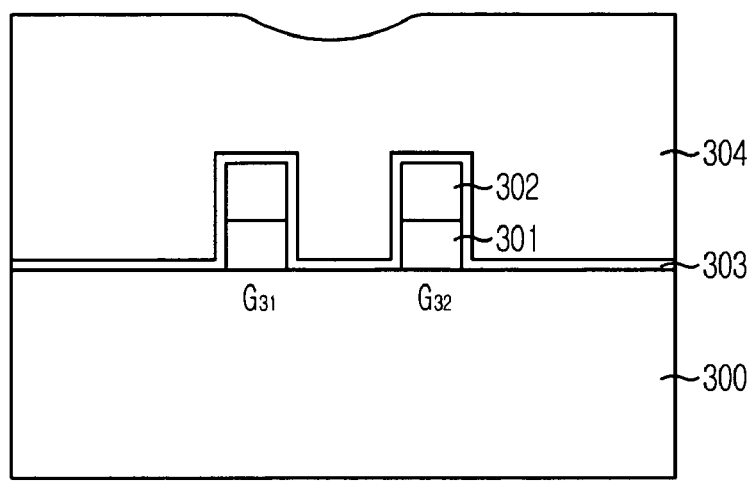
FIGS. 2A to 2F are cross-sectional views illustrating a process for forming a plurality of cell contacts in accordance with the present invention.

First, referring to FIG. 2A, a plurality of gate electrode patterns G31 and G32 are formed on a substrate 300 provided with various device elements such as a field layer and a well (not shown). Herein, each of the plurality of gate electrode patterns G31 and G32 are formed by stacking a gate hard mask 302 and a gate conductive layer 301.

A gate insulation layer exists between the gate conductive layer 301 and the substrate 300. The gate insulation layer is made of a typical oxide-based layer; however, the gate insulation layer is omitted herein.

The gate conductive layer 301 is made of a material selected from a group consisting of polysilicon, tungsten (W), tungsten nitride (WN) and tungsten silicide ($WSi_x$). Also, it is possible to form the gate conductive layer by using a material combining these listed materials.

The gate hard mask 302 serves a role in protecting the gate conductive layer 301 in the course of an etching process for forming a plurality of contact holes by etching an inter-layer insulation layer. The gate hard mask 302 is made of a material having a very different etching speed from the inter-layer insulation layer. For instance, in case of using an oxide-based layer for forming the inter-layer insulation layer, a nitride-based layer such as a silicon nitride (SiN) layer or a silicon oxynitride (SiON) layer is used and in case of using a polymer based low k-dielectric layer for forming the inter-layer insulation layer, an oxide-based layer is used.

An impurity diffusion region (not shown) such as a source/drain junction is formed on the substrate 300 between the plurality of gate electrode patterns G31 and G32. A spacer (not shown) is formed along a profile formed with the plurality of gate electrode patterns G31 and G32 and then, an etch stop layer 303 is formed to prevent an attack on lower structures such as the spacer and the plurality of gate electrode patterns G31 and G32 from the etching process by employing a subsequent SAC etching method on the above resulting substrate. At this time, it is preferable to form the etch stop layer 303 along the profile of the lower structure. The etch stop layer 303 uses a nitride-based layer.

Subsequently, an oxide-based inter-layer insulation layer 304 is formed on the above resulting substrate provided with the etch stop layer 303.

In case of using an oxide-based layer for forming the inter-layer insulation layer 304, a material selected from a group consisting of a boro-silicate-glass (BSG) layer, a boro-phospho-silicate-glass (BPSG) layer, a phospho-silicate-glass (PSG) layer, a tetra-ethyl-ortho-silicate (TEOS) layer, a high density plasma (HDP) oxide layer, a spin-on-glass (SOG) layer and an advanced planarization layer (APL) is used. Also, it is possible to use an inorganic or organic based low k-dielectric layer to form the inter-layer insulation layer.

Figure 2B:
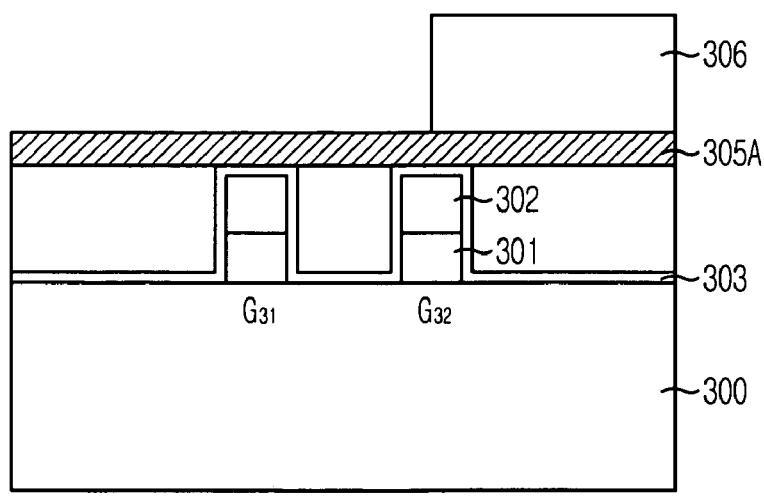

Subsequently, referring to FIG. 2B, the inter-layer insulation layer 304 is planarized by employing a chemical mechanical polishing (CMP) process. The inter-layer insulation layer 304 remains in a thickness equal to or less than approximately 500 Å on upper portions of the plurality of gate hard masks, i.e., targets to expose the etch stop layer 303 or upper portions of the plurality of gate electrode patterns G31 and G32.

Furthermore, there is a height difference with a thickness equal to or less than approximately 200 Å between a region where the plurality of gate electrode patterns G31 and G32 exist and a region where the inter-layer insulation layer 304 exists.

Subsequently, a polysilicon layer 305A for forming a sacrificial hard mask is formed on the inter-layer insulation layer.

The polysilicon layer 305A for forming the sacrificial hard mask is patterned to become the sacrificial hard mask by a subsequent process for the purposes of securing an etching tolerance of a photoresist due to a limitation of a resolution in the course of performing a photolithography process and preventing a pattern deformation. Accordingly, the polysilicon layer 305A for forming the sacrificial hard mask has a higher etch selectivity with respect to the oxide layer than to the nitride layer, thereby serving an excellent role of the hard mask.

The polysilicon layer 305A for forming the sacrificial hard mask is deposited in a thickness ranging from approximately 500 Å to approximately 1,500 Å at a temperature ranging from approximately 500° C. to approximately 600° C. Furthermore, it is preferable to maintain an impurity concentration inside of the polysilicon layer 305A in a range from approximately $1.5 \times 10^{20}$ to approximately $2.5 \times 10^{20}$ in case of measuring the concentration by using a secondary ion mass spectrometer (SIMS).

Subsequently, a photoresist pattern 306 for forming a plurality of cell contact plugs is formed on the polysilicon layer 305A for forming the sacrificial hard mask. The photoresist pattern is an I-type.

Meanwhile, during forming the photoresist pattern 306, an anti-reflective coating layer can be used between the photoresist pattern 306 and a lower structure of the photoresist pattern for the purpose of preventing an undesirable pattern formation from a scattered reflection due to a high degree of light reflection during a photo-exposure for a pattern formation and improving an adhesiveness between the photoresist pattern and the lower structure of the photoresist pattern. At this time, the anti-reflective coating layer mainly uses an organic based material having a similar etching property with the photoresist pattern. However, according to a process, the anti-reflective coating layer can be omitted.

More specific to the process for forming the photoresist pattern 306, a photoresist for ArF or $F_2$ light source, e.g., COMA or acrylate which is the photoresist for ArF light source, is coated on the anti-reflective coating layer or the polysilicon layer 305A for forming the sacrificial hard mask in a predetermined thickness by performing a spin coating method. Afterwards, predetermined portions of the photoresist are selectively photo-exposed by employing the ArF or $F_2$ light source and a predecided reticle (not shown) for defining a width of a contact hole. Thereafter, a developing process proceeds by making a photo-exposed portion or a non-photo-exposed portion remain, and a cleaning process is then performed to remove etch remnants, thereby forming the photoresist pattern 306 which is a cell contact open mask.

Figure 2C:
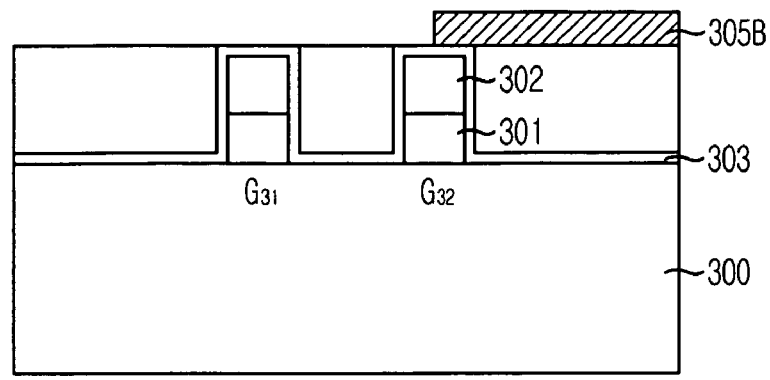

Next, referring to FIG. 2C, a sacrificial hard mask 305B defining a region provided with the plurality of cell contact plugs is formed by etching the polysilicon layer 305A for forming the sacrificial hard mask with use of the photoresist pattern 306 as an etch mask.

At this time, it is preferable to use one of transformer coupled plasma (TCP) type apparatus or a magnetic enhanced reactive ion etcher type apparatus.

Next, the photoresist pattern 306 is removed by employing a photoresist stripping process. In case of using the oxide-based anti-reflective coating layer, the photoresist pattern is removed by the photoresist stripping process.

Figure 2D:
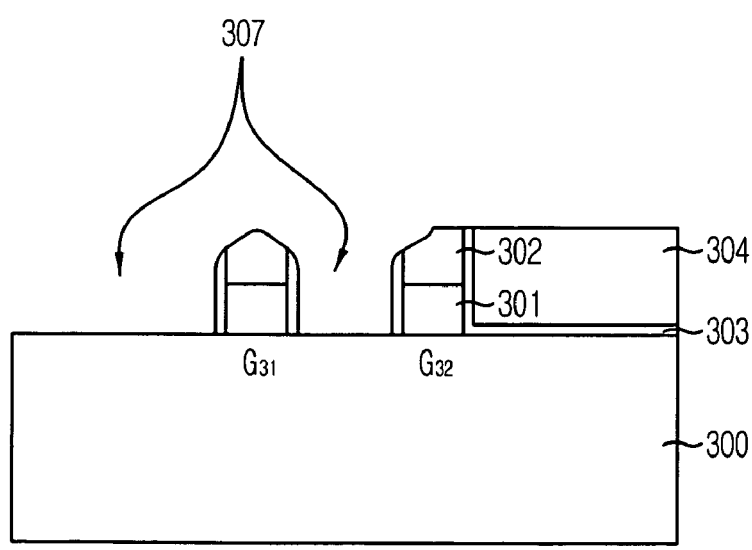

Referring to FIG. 2D, a plurality of contact holes 307 exposing the etch stop layer 303 is formed between the plurality of gate electrode patterns G31 and G32 by performing an self aligned contact (SAC) etching process etching the inter-layer insulation layer 304 with use of the sacrificial hard mask 305B as an etch mask.

At this time, a typical recipe for the SAC etching process is employed. That is, a fluoride based plasma, e.g., $C_xF_y$ (x and y range from approximately 1 to approximately 10) gas such as $C_2F_4$, $C_2F_6$, $C_3F_8$, $C_4F_6$, $C_5F_8$ or $C_5F_{10}$, is used as a main etch gas along with an additional $C_aH_bF_c$ (a,b and c range from approximately 1 to approximately 10) gas such as $CH_2F_2$, $C_3HF_5$ or $CHF_3$. At this time, an inert gas such as He, Ne, Ar or Xe is used as a carrier gas.

More specific to the SAC etching process, a pressure ranging from approximately 20 mTorr to approximately 60 mTorr maintains in the MERIE type apparatus and a radio frequency (RF) source power ranging form approximately 400 W to approximately 1,000 W is required along with a bias power ranging from approximately 500 w to approximately 1,000 W. At this time, $C_5F_8$ ranging from approximately 2 SCCM to approximately 10 SCCM, $CH_2F_2$ ranging from approximately 0 SCCM to approximately 10 SCCM, $O_2$ ranging form approximately 0 SCCM to approximately 10 SCCM and Ar ranging from approximately 500 SCCM to approximately 1,000 SCCM are used.

Next, the sacrificial hard mask 305B is removed though a dry etch by providing an etch condition with a high etch selectivity of polisilicon and the oxide layer or the nitride layer in an etcher etching polysilicon. At this time, the etching process is performed in the TCP type apparatus or the MERIE type apparatus and the etch stop layer 303 remains in a thickness equal to or more than approximately 100 Å on lower portions of the plurality of contact holes 307.

Next, polymer based residues generated during the etching process are removed by using a buffered oxide etchant (BOE) diluted by approximately 100-fold to approximately 300-fold.

Next, the etch stop layer 303 on the lower portions of the plurality of contact holes 307 is removed by using a blanket-etch process, thereby exposing the substrate 300, i.e., the impurity diffusion region of the substrate 300.

Meanwhile, during removing the sacrificial hard mask 305B, some portions of the gate hard mask 302 and the etch stop layer 303 are simultaneously etched, thereby decreasing an etch target during the dry etch process for removing the etch stop layer 303. Accordingly, a height of the remaining gate hard mask 302 is maintained enough.

Figure 2E:
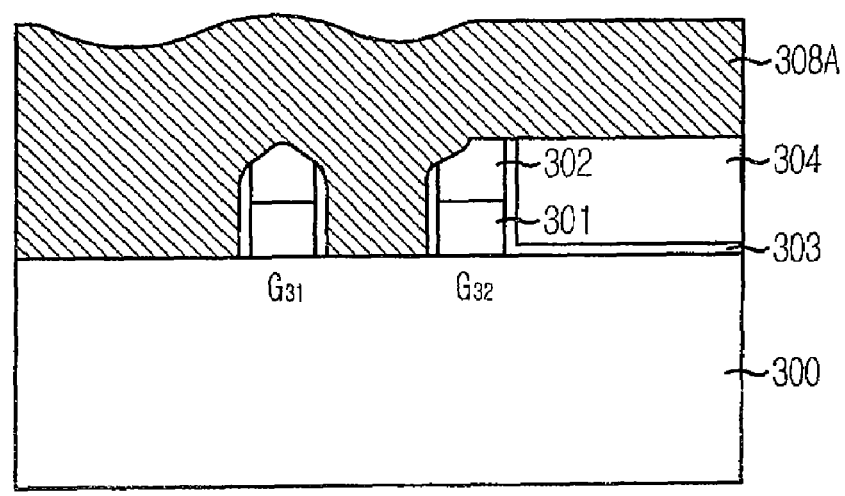

Next, referring to FIG. 2E, a conductive layer 308A for forming a plurality of plugs is deposited in the above resulting structure where the lower portions of the plurality of contact holes are opened, thereby filling the plurality of contact holes 307 sufficiently.

The conductive layer 308A for forming the plurality of plugs is made of a polysilicon layer and deposited in a thickness ranging from approximately 1,500 Å to approximately 3,000 Å not to generate a void inside of the plurality of contact holes 307 while depositing the polysilicon layer.

Figure 2F:
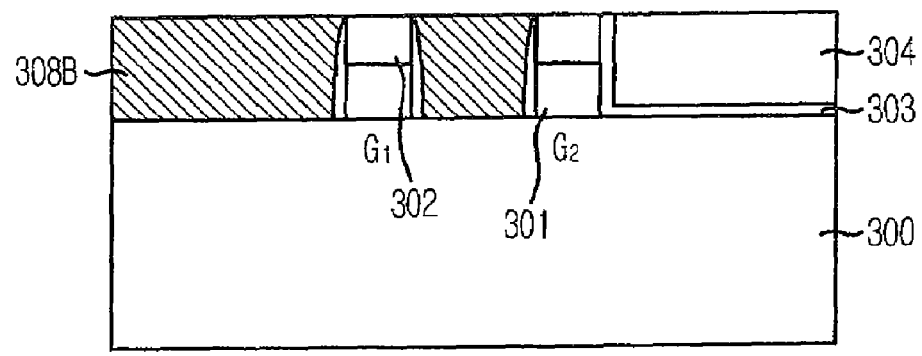

Next, referring to FIG. 2F, a planarization process is performed for isolating the plurality of plugs. However, at this time, the etching process using the dry etch process is employed instead of using the CMP process used for the prior art, thereby forming a plurality of isolated plugs 308B.

In case of using the etch back process which is the most critical technology in accordance with the present invention, the conductive layer 308A for forming the plurality of plugs placed in a peripheral region is first removed by employing a recipe for minimizing an anfractuous pattern and a height difference generated during depositing the conductive layer 308A for forming the plurality of plugs shown in FIG. 2E. Then, a first etching process is subjected to the gate hard mask 302 in a cell region until exposing the gate hard mask to have a thickness equal to or less than approximately 200

Å. At this time, an etch selectivity of polysilicon forming the conductive layer 308A used for forming the plurality of plugs with respect to the nitride layer forming the oxide layer of the gate hard mask 302 is equal to or less than a ratio of approximately 1 to approximately 1.2. Accordingly, a height difference between the conductive layer for forming the plurality of plugs and the nitride layer for forming the gate hard mask is maintained in a thickness equal to or less than approximately 200 Å.

The planarization process using the etch back process in accordance with the present invention is largely divided into two etching steps.

A first step is to etch the conductive layer 308A for forming the plurality of plugs, thereby removing curved surfaces of the conductive layer 308A for forming the plurality of plugs and a second step is to apply an etching process as simultaneously removing a height difference between the inter-layer insulation layer for forming polysilicon and the nitride layer for forming the oxide layer and the gate hard mask.

For the first step, an apparatus having a microwave source is used. At this time, a pressure within a chamber is maintained in a range between approximately 700 mTorr and approximately 1,000 mTorr and a microwave power ranging from approximately 700 W to approximately 1,000 W are used. Also, a RF power ranging from approximately 300 W to approximately 400 W is used. Furthermore, $CF_4$ ranging from approximately 150 SCCM to approximately 250 SCCM and $O_2$ ranging from approximately 200 SCCM to approximately 400 SCCM are used.

For the second step, the TCP type apparatus is used and this second step is divided into three parts again.

First, $C_2F_6$ ranging from approximately 30 SCCM to approximately 150 SCCM is used. A source power raging from approximately 200 W to approximately 500 W and a bias power ranging from approximately 70 W to approximately 150 W are used as maintaining a pressure inside of the chamber in a range from approximately 4 mTorr to approximately 20 mTorr.

Next, $Cl_2$ ranging from approximately 20 SCCM to approximately 100 SCCM, HBr ranging from approximately 0 SCCM to approximately 100 SCCM and $O_2$ ranging from approximately 0 SCCM to approximately 100 SCCM are used. The source power ranging from approximately 200 W to approximately 500 W and the bias power ranging from approximately 30 W to approximately 150 W are used as maintaining the pressure inside of the chamber in a range from approximately 4 mTorr to approximately 15 mTorr.

Lastly, $C_2F_6$ ranging from approximately 30 SCCM to approximately 150 SCCM is used and the source power ranging from 200 W to approximately 500 W and the bias power ranging from approximately 70 W to approximately 150 W are used as maintaining the pressure inside of the chamber in a range from approximately 4 mTorr to approximately 20 mTorr.

Subsequently, a height difference between the inter-layer insulation layer 304 and the plurality of plugs 308B is decreased through a cleaning process using the BOE diluted by approximately 100 fold to approximately 300 fold.

The most important point of the etching process is to delicately control the etch selectivity of polysilicon which is a required condition for a dry etch with respect to the oxide layer or the nitride layer and to control the polysilicon and the oxide layer or the nitride layer as etch targets. Furthermore, it is required to minimize a height difference between the gate hard mask or the inter-layer insulation layer and the polysilicon.

Although the embodiment of the present invention exemplifies the process for forming the cell contact plug, a process for forming a bit line contact or a storage node contact can be used for the present invention.

Accordingly, in case of the process for forming the storage node contact plug, the impurity diffusion region in a lower structure can be replaced with a cell contact plug or a contact pad and the gate electrode pattern can be replaced with a bit line.

The present invention removes a part of an inter-layer insulation layer during forming an I-type contact hole pattern; reduces an etch target in the course of a SAC etching process; replaces a sacrificial hard mask to polysilicon; and employs an etch back process re-adjusting an etch recipe, thereby providing following advantages.

A) By applying an etch back process during a plug isolation, a Pinocchio defect that is a fundamental problem caused by a CMP process can be prevented and a subsequent cleaning process performed according to particles can be simplified so that it is possible to develop products with a high quality and a high speed.

B) It is possible to perform a plug isolation by employing an etch back process so that the CMP process with a high unit process cost can be replaced with the etch back process, thereby providing a good economical effect.

C) An etch target for forming the I-type contact hole can be reduced by more than approximately 30% compared with the prior art, thereby decreasing an etching period by more than approximately 30%. Accordingly, a loss in a plurality of hard masks of a plurality of conductive patterns can be decreased, thereby lowering a thickness of the plurality of hard masks of the plurality of conductive patterns by a thickness of approximately 200 Å. A decrease in the thickness of the plurality of hard mask of the plurality of conductive patterns helps to manage a critical dimension (CD) bias between a cell region and a peripheral region and prevents a void generation during filling a gap between the plurality of conductive patterns by using an inter-layer insulation layer.

D) During the SAC etching process, a process for depositing a capping layer can be omitted because the plurality of hard masks of the conductive patterns are decreased.

E) A decrease in the SAC etch target and an increase in an etch selectivity of a sacrificial hard mask with respect to an inter-layer insulation layer makes it possible to improve a CD non-uniformity of a wafer to a wafer and within a wafer and secure a CD margin of the inter-layer insulation layer.

F) An etch tolerance of a photoresist used for a photolithography process with a high resolution using an ArF light source can be secured through a high etch selectivity of a sacrificial hard mask, thereby decreasing a design rule.

The present invention prevents a Pinocchio defect that is a fundamental problem caused by the CMP process and simplifies a subsequent cleaning process performed according to the particles. Accordingly, it is possible to develop products with a high quality and a high speed and to replace the CMP process having a high unit process cost with an etch back process, thereby providing an effect of increasing a price competitiveness.

The present application contains subject matter related to the Korean patent application No. KR 2004-0041725, filed in the Korean Patent Office on Jun. 8, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for forming a plurality of contact plugs of a semiconductor device, the method comprising:
   forming a plurality of conductive patterns having a plurality of hard masks on a substrate;
   forming an etch stop layer over the plurality of conductive patterns, the etch stop layer conforming to a profile of the plurality of conductive patterns;
   forming an inter-layer insulation layer on the etch stop layer;
   planarizing the inter-layer insulation layer until the inter-layer insulation layer has a thickness of no more than 500 Å on a portion of the etch stop layer that is provided at an upper portion of the conductive patterns;
   forming a polysilicon layer on the inter-layer insulation layer;
   forming a plurality of contact holes exposing the etch stop layer between the plurality of conductive patterns by using the polysilicon layer as an etch mask;
   removing the polysilicon etch mask and the etch stop layer in lower portions of the plurality of contact holes;
   forming a conductive layer for forming a plurality of plugs to fill the plurality of contact holes; and
   forming a plurality of isolated plugs by performing a planarizing process using an etch back process to expose the plurality of hard masks.

2. The method of claim 1, the method further includes:
   forming a photoresist pattern on the polysilicon layer, the photoresist pattern being an I-type;
   forming a sacrificial hard mask pattern by etching the polysilicon layer with use of the photoresist pattern as an etch mask; and
   removing the photoresist pattern,
   wherein the plurality of contact holes are formed using the sacrificial hard mask.

3. The method of claim 1, wherein the conductive patterns are gate patterns.

4. The method of claim 1, wherein the plurality of hard masks include a nitride layer; the inter-layer insulation layer includes an oxide layer; and the conductive layer for forming the plurality of plugs includes polysilicon.

5. The method of claim 1, wherein further includes a step of performing a cleaning process by using a buffered oxide etchant (BOE) after the step of forming the plurality of isolated plugs.

6. The method of claim 1, wherein the step of planarizing the inter-layer insulation layer results in a height difference between the plurality of hard masks and the inter-layer insulation layer placed between the plurality of conductive patterns of no more than 200 Å.

7. The method of claim 1, wherein the polysilicon layer is formed to a thickness of approximately 500Å to approximately 1,500 Å.

8. The method of claim 2, wherein the step of forming the photoresist pattern employs a photolithography using one of ArF and $F_2$ light source.

9. The method of claim 4, wherein the planarizing process used to form the plurality of isolated plugs includes first etching the conductive layer for forming the plurality of plugs to remove curved surfaces thereof, and second etching to reduce a height difference between the oxide layer and the plurality of hard masks.

10. The method of claim 4, wherein the step of forming the plurality of contact holes uses a $C_xF_y$ (x and y range from approximately 1 to approximately 10) gas as a main etch gas, and a gas selected from a group consisting of $CH_2F_2$, $C_3HF_5$ and $CHF_3$, and an inert gas selected from a group consisting of He, Ne, Ar and Xe as a carrier gas.

11. The method of claim 9, wherein the first etching proceeds in an apparatus having a microwave source and uses $CF_4$ and $O_2$.

12. The method of claim 9, wherein the second etching is performed in a transformer coupled plasma (TCP) type apparatus.

13. The method of claim 9, wherein the first etching is performed by using a microwave power ranging from approximately 700 W to approximately 1,000 W and a radio frequency (RF) power ranging from approximately 300 W to approximately 400 W in a chamber with a pressure ranging from approximately 700 mTorr to approximately 1,000 mTorr along with $CF_4$ ranging from approximately 150 SCCM to approximately 250 SCCM and $O_2$ ranging from approximately 200 SCCM to approximately 400 SCCM.

14. The method of claim 9, wherein the second etching comprises:
   etching by using $C_2F_6$ ranging from approximately 30 SCCM to approximately 150 SCCM along with a source power ranging from approximately 200 W to approximately 500 W and a bias power ranging from approximately 70 W to approximately 150 W at a pressure inside of a chamber ranging from approximately 4 mTorr to approximately 20 mTorr;
   etching by using $Cl_2$ ranging from approximately 20 SCCM to approximately 100 SCCM, HBr ranging from approximately 0 SCCM to approximately 100 SCCM and $O_2$ ranging from approximately 0 SCCM to approximately 100 SCCM along with a source power ranging from approximately 200 W to approximately 500 W and a bias power ranging from approximately 30 W to approximately 150 W at a pressure inside of the chamber ranging from approximately 4 mTorr to approximately 15 mTorr; and
   etching by using $C_2F_6$ ranging from approximately 30 SCCM to approximately 150 SCCM along with a source power ranging from approximately 20 W to approximately 500 W and a bias power ranging from approximately 70 W to approximately 150 W at a pressure inside of the chamber ranging from approximately 4 mTorr to approximately 20 mTorr.

15. A method for forming a plurality of contact plugs of a semiconductor device, the method comprising:
   forming a plurality of gate patterns over a substrate, each gate pattern having a gate hard mask;
   forming a layer conforming to a profile of the plurality of gate patterns;
   forming an insulation layer over the conforming layer;
   removing the insulation layer until an upper portion of the insulation layer is substantially flushed to an upper portion of the conforming layer;
   forming a polysilicon etch mask over the upper portion of the insulation layer that is substantially flushed to the upper portion of the conforming layer;
   forming a plurality of contact holes between the plurality of gate patterns by using the polysilicon layer etch mask;
   forming a conductive layer to fill the plurality of contact holes; and
   forming a plurality of isolated plugs within the contact holes by removing the conductive layer using an etch-back process.

16. The method of claim 15, wherein forming the plurality of isolated plugs comprises:

a first etch step configured to reduce a thickness of the conductive layer; and a second etch step configured to reduce a height difference between the gate hard mask and the insulation layer.

17. The method of claim 16, wherein the gate hard masks are etched and provided with curved surfaces when the plurality of the contact holes are formed, wherein the first etch step etches the curved surfaces of the gate hard masks and reduce the curvature of the curved surfaces.

18. The method of claim 15, wherein a height difference between the upper portion of the insulation layer between the upper portion of the conforming layer is no more than 500 Å.

19. The method of claim 15, further comprising:

removing the polysilicon etch mask and the conforming layer prior to forming the conductive layer to fill the contact holes, wherein the conductive layer is a polysilicon layer.

20. A method for forming a plurality of contact plugs of a semiconductor device, the method comprising:

forming a plurality of gate patterns over a substrate, each gate pattern having a gate hard mask;

forming an insulation layer over the gate patterns;

removing the insulation layer until an upper portion of the insulation layer is substantially flushed to an upper portion of the gate patterns;

forming a polysilicon etch mask over the upper portion of the insulation layer;

forming a plurality of contact holes between the plurality of gate patterns by using the polysilicon layer etch mask, the contact holes exposing the substrate;

forming a second polysilicon layer to fill the plurality of contact holes; and forming a plurality of isolated plugs within the contact holes by removing the second polysilicon layer using an etchback process involving at least two different etch steps.

* * * * *